(12) United States Patent
Peddada et al.

(10) Patent No.: US 10,707,387 B2
(45) Date of Patent: Jul. 7, 2020

(54) DICING A WAFER OF LIGHT EMITTING DEVICES

(71) Applicant: Lumileds LLC, San Jose, CA (US)

(72) Inventors: Satyanarayana Rao Peddada, San Jose, CA (US); Frank L. Wei, San Jose, CA (US)

(73) Assignee: Lumileds LLC, San Hose, CA (US)

( * ) Notice: Subject to any disclaimer, the term of this patent is extended or adjusted under 35 U.S.C. 154(b) by 0 days.

(21) Appl. No.: 14/905,865

(22) PCT Filed: Jul. 7, 2014

(86) PCT No.: PCT/IB2014/062907
§ 371 (c)(1),
(2) Date: Jan. 18, 2016

(87) PCT Pub. No.: WO2015/008189
PCT Pub. Date: Jan. 22, 2015

(65) Prior Publication Data
US 2016/0163934 A1 Jun. 9, 2016

Related U.S. Application Data

(60) Provisional application No. 61/847,693, filed on Jul. 18, 2013.

(51) Int. Cl.
*H01L 33/52* (2010.01)
*H01L 33/50* (2010.01)
(Continued)

(52) U.S. Cl.
CPC .......... *H01L 33/52* (2013.01); *H01L 33/0095* (2013.01); *H01L 33/32* (2013.01);
(Continued)

(58) Field of Classification Search
CPC ..... H01L 2933/0033; H01L 2933/0041; H01L 2933/005
See application file for complete search history.

(56) References Cited

U.S. PATENT DOCUMENTS 6,257,224 B1 * 7/2001 Yoshino ............... B28D 5/0005
125/13.01
7,008,861 B2 3/2006 Andrews et al.
(Continued)

FOREIGN PATENT DOCUMENTS

CN 1722456 A 1/2006
EP 2194586 A1 6/2010
(Continued)

OTHER PUBLICATIONS

Extended European Search Report dated Dec. 1, 2016, EP Application 16181266.4, 7 pages.
(Continued)

*Primary Examiner* — Briggite A Paterson
(74) *Attorney, Agent, or Firm* — Volpe & Koenig, P.C.

(57) ABSTRACT

Some embodiments include a III-nitride light emitting device with a light emitting layer disposed between an n-type region and a p-type region. A glass layer is connected to the III-nitride light emitting device. A wavelength converting layer is disposed between the III-nitride light emitting device and the glass layer. The glass layer is narrower than the III-nitride light emitting device.

7 Claims, 4 Drawing Sheets

(51) Int. Cl.
  *H01L 33/00* (2010.01)
  *H01L 33/32* (2010.01)
  *H01L 33/56* (2010.01)

(52) U.S. Cl.
  CPC ............ *H01L 33/502* (2013.01); *H01L 33/56* (2013.01); *H01L 33/0079* (2013.01); *H01L 33/50* (2013.01); *H01L 33/505* (2013.01); *H01L 2933/005* (2013.01); *H01L 2933/0033* (2013.01); *H01L 2933/0041* (2013.01)

(56) References Cited

U.S. PATENT DOCUMENTS

| | | | |
|---|---|---|---|
| 7,598,154 B2 | 10/2009 | Izumi | |
| 7,749,867 B2 | 7/2010 | Fukuyo et al. | |
| 8,056,198 B2 | 11/2011 | Nakazawa | |
| 8,759,195 B2 | 6/2014 | Morikazu et al. | |
| 9,006,766 B2 | 4/2015 | Kojima et al. | |
| 9,360,204 B2 | 6/2016 | Fukuda et al. | |
| 2001/0012744 A1* | 8/2001 | Cathey | H01J 9/185 445/24 |
| 2004/0021968 A1* | 2/2004 | Sakamoto | G02B 5/20 359/886 |
| 2006/0006486 A1* | 1/2006 | Seo | H01L 24/97 257/433 |
| 2007/0004174 A1* | 1/2007 | Harris, Jr. | H01L 21/67092 438/460 |
| 2007/0176192 A1* | 8/2007 | Leatherdale | H01L 33/58 257/98 |
| 2008/0003926 A1* | 1/2008 | Watanabe | H01L 21/50 451/54 |
| 2009/0026620 A1* | 1/2009 | Ohta | H01L 21/4857 257/758 |
| 2010/0051984 A1* | 3/2010 | West | H01L 33/44 257/98 |
| 2010/0102341 A1 | 4/2010 | Tsutsumi et al. | |
| 2010/0133999 A1* | 6/2010 | Hsu | H01L 33/50 313/506 |
| 2010/0140640 A1 | 6/2010 | Shimokawa et al. | |
| 2010/0148198 A1 | 6/2010 | Sugizaki et al. | |
| 2010/0295077 A1 | 11/2010 | Melman | |
| 2011/0263058 A1 | 10/2011 | Yamae et al. | |
| 2011/0266569 A1 | 11/2011 | Basin | |
| 2012/0242216 A1 | 9/2012 | Kotani | |
| 2012/0319563 A1* | 12/2012 | Ishihara | H01L 33/505 313/498 |
| 2013/0095586 A1 | 4/2013 | Kim et al. | |
| 2013/0188030 A1* | 7/2013 | Igarashi | A61B 1/051 348/65 |
| 2013/0221393 A1* | 8/2013 | Mao | H01L 33/44 257/98 |
| 2013/0299864 A1* | 11/2013 | Sugizaki | H01L 33/486 257/98 |

FOREIGN PATENT DOCUMENTS

| | | |
|---|---|---|
| JP | 61-142071 A | 6/1986 |
| JP | 02-260670 A | 10/1990 |
| JP | 06-005700 A | 1/1994 |
| JP | 07-183255 A | 7/1995 |
| JP | 09-141648 A | 6/1997 |
| JP | 10-044139 A | 2/1998 |
| JP | 11-224866 A | 8/1999 |
| JP | 2000-022213 A | 1/2000 |
| JP | 2001-210905 A | 8/2001 |
| JP | 2002-043254 A | 2/2002 |
| JP | 2002-210664 A | 7/2002 |
| JP | 2003-017790 A | 1/2003 |
| JP | 2003-124151 A | 4/2003 |
| JP | 2003-197564 A | 7/2003 |
| JP | 2003-282957 A | 10/2003 |
| JP | 2005-191232 A | 7/2005 |
| JP | 2005294617 A | 10/2005 |
| JP | 2007-242882 A | 9/2007 |
| JP | 2009-088252 A | 4/2009 |
| JP | 2010-192724 A | 9/2010 |
| JP | 2011-020231 A | 2/2011 |
| JP | 2012-192487 A | 10/2012 |
| JP | 2013-012559 A | 1/2013 |
| TW | 201027804 A | 7/2010 |
| TW | 201031033 A | 8/2010 |
| WO | WO-2012132236 A1 | 10/2012 |
| WO | 2012/164437 A2 | 12/2012 |
| WO | WO-2013061511 A1 | 5/2013 |

OTHER PUBLICATIONS

Extended European Search Report dated Dec. 1, 2016, EP Application No. 16181268.0, 7 pages.
EPO as ISA, PCT/IB2014/062907, filed Jul. 7, 2014, "International Search Report and Written Opinion" dated May 19, 2015, 14 pages.
Levinson, Gideon, "Principles of Dicing", ADT = Dicing, Advanced Dicing Technologies, Advanced Dicing Technologies Ltd., Advanced Technology Center, Haifa, Israel, Distributed by Inseto (UK) Limited, 11 pages.
First Office Action dated Dec. 8, 2017, China Patent Application No. 201480041215.6, 10 pages.
Taiwan Office Action dated Jan. 10, 2018, Taiwan Application No. 103124828, 11 pages.
Re-Examination Decision issued Jun. 7, 2018, Taiwan Application No. 103124828, 5 pages.

* cited by examiner

DICING A WAFER OF LIGHT EMITTING DEVICES

CROSS-REFERENCE TO RELATED APPLICATIONS

The present application is a § 371 application of International Application No. PCT/IB2014/062907 filed on Jul. 7, 2014 and entitled "Dicing a Wafer of Light Emitting Devices," which claims the benefit of U.S. Provisional Application Ser. No. 61/847,693, filed Jul. 18, 2013. Both PCT/IB2014/062907 and U.S. 61/847,693 are incorporated herein.

FIELD OF THE INVENTION

The present invention relates to dicing a wafer of light emitting devices.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

SUMMARY

It is an object of the invention to provide a method of dicing a wafer including light emitting devices, a wavelength converting layer, and a transparent layer.

Some embodiments include a method of dicing a wafer of light emitting devices. The wafer includes a glass layer, a light emitting device layer including a plurality of light emitting devices separated by dielectric, and a wavelength converting layer disposed between the glass layer and the light emitting device layer. The method includes sawing the wafer in a region of dielectric with a metal-bonded diamond grit blade.

Some embodiments include a method of dicing a wafer of light emitting devices. The wafer includes a transparent layer, a light emitting device layer including a plurality of light emitting devices separated by dielectric, and a wavelength converting layer disposed between the transparent layer and the light emitting device layer. The method includes cutting a first portion of a thickness of the wafer in a first cutting process and cutting the remaining thickness of the wafer in a second cutting process.

Some embodiments include a III-nitride light emitting device with a light emitting layer disposed between an n-type region and a p-type region. A glass layer is connected to the III-nitride light emitting device. A wavelength converting layer is disposed between the III-nitride light emitting device and the glass layer. In a plane parallel to a top surface of the III-nitride light emitting device, the glass layer has a smaller lateral extent than the III-nitride light emitting device.

DETAILED DESCRIPTION

Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 1:
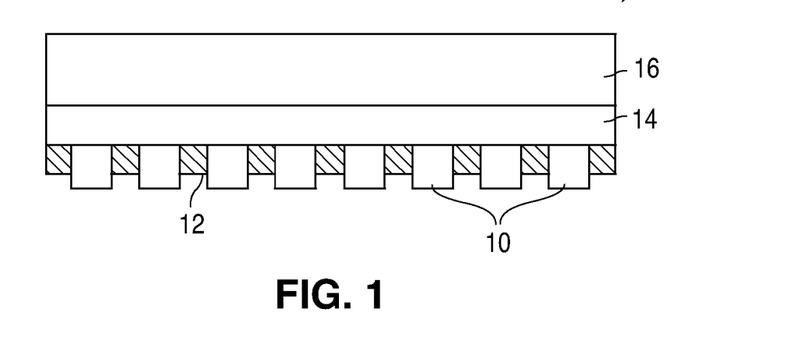
FIG. 1 illustrates a wafer including LEDs, a wavelength converting layer, and a transparent layer.

FIG. 1 illustrates a portion of a wafer 100 of III-nitride LEDs. A plurality of LEDs 10 are attached to a wavelength converting layer 14 and a transparent layer 16. The wavelength converting layer 14 is disposed between transparent layer 16 and LEDs 10 in some embodiments.

The wavelength converting layer 14 may be, for example, wavelength converting particles such as a powder phosphor disposed in a transparent material such as silicone. The wavelength converting layer 14 may be a flexible film that is formed separately from LEDs 10 then laminated over a wafer of LEDs 10.

Transparent layer 16 may be, for example, a glass layer. Transparent layer 16 may contain other, non-transparent materials such as scattering particles or wavelength converting particles in some embodiments.

A dielectric material (hatched area) 12 such as epoxy separates neighboring LEDs 10. Other materials such as reflective particles may be disposed in the dielectric material.

Figure 2:
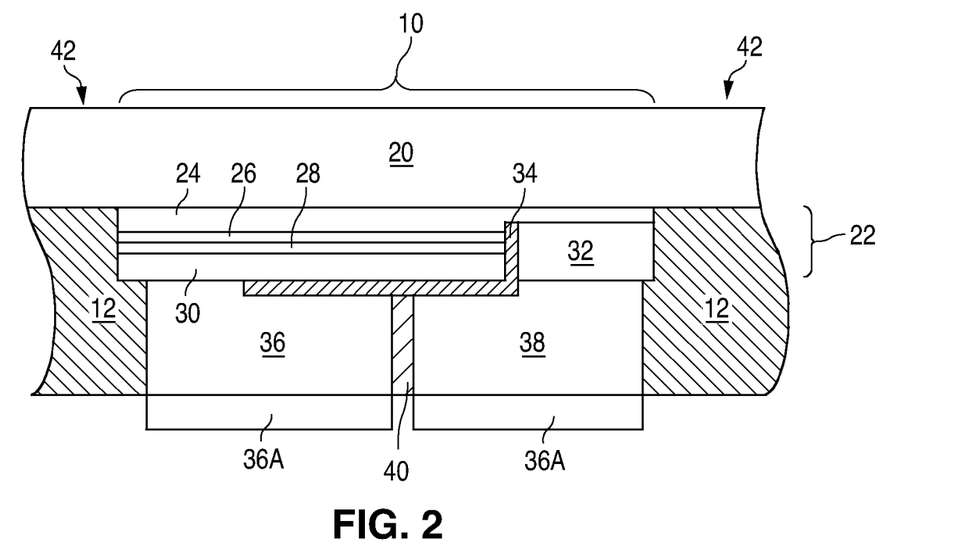
FIG. 2 illustrates an example of an LED.

FIG. 2 illustrates one example of a single LED 10. Any suitable semiconductor light emitting device may be used and embodiments of the invention are not limited to the device illustrated in FIG. 2. The LED illustrated in FIG. 2 and the portion of a wafer 100 illustrated in FIG. 1 may be formed as follows. A semiconductor structure 22 is grown on a growth substrate 20 as is known in the art. The growth substrate is often sapphire but may be any suitable substrate such as, for example, SiC, Si, GaN, or a composite substrate. The semiconductor structure 22 includes a light emitting or active region sandwiched between n- and p-type regions. An n-type region 24 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 26 is grown over the n-type region. Examples of suitable light emitting regions include a single thick or thin light emitting layer, or a multiple quantum well light emitting region including multiple thin or thick light emitting layers separated by barrier layers. A p-type region 28 may then be grown over the light emitting region. Like the n-type region 24, the p-type region 28 may include multiple layers of different composition, thickness, and dopant concentration, including layers that are not intentionally doped, or n-type layers.

After growth of the semiconductor structure, a p-contact 30 is formed on the surface of the p-type region 28. The p-contact 30 often includes multiple conductive layers such as a reflective metal and a guard metal which may prevent or reduce electromigration of the reflective metal. The reflective metal is often silver but any suitable material or materials may be used. After forming the p-contact 30, a portion of the p-contact 30, the p-type region 28, and the active region 26 is removed to expose a portion of the n-type region 24 on which an n-contact 32 is formed. The n- and p-contacts 32 and 30 are electrically isolated from each other by a gap which may be filled with a dielectric 34 (shown hatched) such as an oxide of silicon or any other suitable material. Multiple n-contact vias may be formed; the n- and p-contacts 32 and 30 are not limited to the arrangement illustrated in FIG. 2. The n- and p-contacts may be redistributed to form bond pads with a dielectric/metal stack, as is known in the art.

Thick metal pads 36 and 38 are formed on and electrically connected to the n- and p-contacts. Pad 38 is electrically connected to n-contact 32. Pad 36 is electrically connected to p-contact 30. Pads 36 and 38 are electrically isolated from each other by a gap 40, which may be filled with a dielectric material. Gap 40 may be filled with the same dielectric material 12 that separates neighboring LEDs 10 in some embodiments, a different solid material, in some embodiments, or air in some embodiments. Gap 40 is shown as hatched. Pad 38 is electrically isolated from the p-contact 30 by dielectric 34, which may extend over a portion of the p-contact 30. Pads 36 and 38 may be, for example, gold, copper, alloys, or any other suitable material formed by plating or any other suitable technique. Pads 36 and 38 in some embodiments are sufficiently thick to support the semiconductor structure 22 such that the growth substrate 20 can be removed. In this case dielectric material 12 provides structural support to the wafer of isolated LEDs.

Many individual LEDs 10 are formed on a single wafer. In the regions 42 between neighboring LEDs 10, the semiconductor structure is entirely removed by etching down to the substrate 20, as illustrated in FIG. 2, or the semiconductor structure is etched down to an electrically insulating layer. As described above in reference to FIG. 1, a dielectric material 12 is disposed in areas 42 between LEDs 10. Dielectric material 12 may mechanically support and/or protect the sides of LEDs 10 during later processing, such as dicing. Dielectric Material 12 may also be formed to prevent or reduce the amount of light from escaping from the sides of LEDs 10. Dielectric material 12 may be, for example, epoxy or any other suitable material, and may be formed by any suitable technique including overmolding, spin-coating, or any other deposition technique. Dielectric material 12 may formed such that it extends over the bottoms of pads 36 and 38 (not shown in FIG. 2). Excess material over pads 36 and 38 may be removed by any suitable technique, such as for example micro bead blasting. In some embodiments, removing excess dielectric material 12 results in a planar surface which includes the bottom surface of dielectric material 12, the bottom surface of material 40, and the bottom surfaces of pads 36 and 38. Pads 36 and 38 may then be extended by patterning and depositing extensions 36A and 38A, which extend below the level of dielectric material 12, as illustrated in FIG. 2.

To form the structure illustrated in FIG. 1, the growth substrate is removed from a wafer of LEDs 10. The growth substrate may be removed by, for example, laser melting, etching, mechanical techniques such as grinding, or any other suitable technique. The semiconductor structure 22 of LEDs 10 may be thinned after removing the growth substrate, and/or the exposed top surface may be roughened, textured, or patterned, for example to improve light extraction from the LEDs 10.

Wavelength converting layer 14 is connected to the surface of LEDs 10 exposed by removing the growth substrate. For example, wavelength converting layer 14 may be laminated over LEDs 10.

Wavelength converting layer 14 may be formed separately from LEDs 10. The wavelength converting layer absorbs light emitted by the LEDs and emits light of one or more different wavelengths. Unconverted light emitted by the LEDs is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light emitted from the structure.

The wavelength converting layer is a suitable transparent material such as silicone or resin loaded with one or more wavelength converting materials such as conventional phosphors, organic phosphors, quantum dots, organic semiconductors, II-VI or III-V semiconductors, II-VI or III-V semiconductor quantum dots or nanocrystals, dyes, polymers, or other materials that luminesce. Though the description below refers to phosphor in silicone, any suitable wavelength converting material or materials and any suitable transparent material may be used. Non-wavelength-converting materials, for example to cause scattering or to alter the index of refraction of the film, may be added to the wavelength converting film.

The wavelength converting layer may be formed on a roll of a support film. The support film may be, for example, a commercially available polymer such as ethyl tetra fluoro ethylene (ETFE) foil in any suitable dimension. To form the wavelength converting layer, a phosphor powder is mixed with silicone, or other suitable binder, to form a slurry, and the slurry is sprayed on or otherwise deposited on the support film to a predetermined thickness in a continuous process (assuming a roll is continuously dispensed). In one embodiment, a YAG phosphor (yellow-green) is used. In another embodiment, the phosphor is mixed red and green phosphors. Any combination of phosphors may be used in conjunction with the LED light to make any color light. The density of phosphor, the thickness of the layer, and the type of phosphor or combination of phosphors are selected so that the light emitted by the combination of the LED die and the phosphor(s) has a target white point or other desired color. In one embodiment, the phosphor/silicone layer will be about 30-200 microns thick. Other inert inorganic particles, such as light scattering materials (e.g., silica, $TiO_2$) may also be included in the slurry. The wavelength converting layer may include multiple wavelength converting layers in some embodiments, and may include non-wavelength converting layers in some embodiments.

The slurry is then dried, such as by infrared lights or other heat sources. The wavelength converting layer may be tested for its color conversion and matched to particular LED dies generating a certain range of peak wavelengths.

To laminate the wavelength converting layer over the LEDs 10, the wavelength converting layer may be unrolled over LEDs 10. The wavelength converting layer 14 may be heated to soften it. An airtight seal may be formed around the periphery of the wafer. A vacuum is created to remove the remaining air between the wavelength converting layer 14 and the LEDs 10. Air between wavelength converting layer 14 and LEDs 10 can escape through small pores in the wavelength converting layer 14. Air is then allowed to enter the chamber to pressurize the chamber, pressing the wavelength converting layer 14 onto LEDs 10.

Any other suitable technique besides lamination may be used to attach wavelength converting layer 14 to LEDs 10.

Transparent layer 16 is then attached to wavelength converting layer 14. Transparent layer 16 may be, for example, a pre-formed glass wafer that is attached to wavelength converting layer 14 by a suitable adhesive such as silicone.

Figure 3:
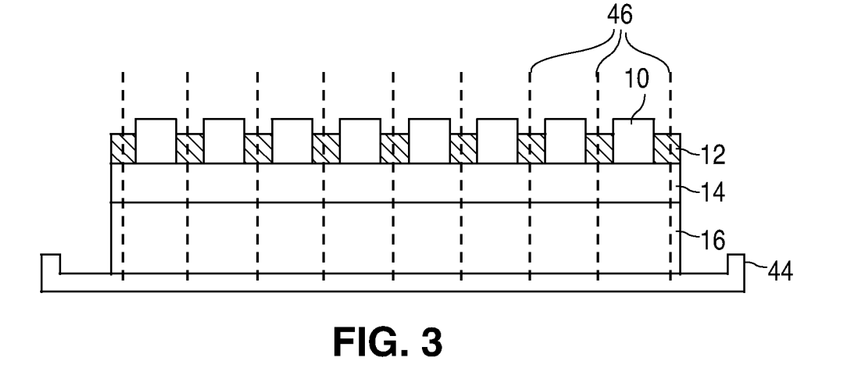
FIG. 3 illustrates the wafer of FIG. 1 disposed on a dicing frame.

The wafer illustrated in FIG. 1 may then be diced into individual LEDs 10 or groups of LEDs 10. In FIG. 3, the structure of FIG. 1 is disposed in a dicing frame 44. In the dicing streets 46, indicated by dashed lines, three dissimilar materials with different mechanical properties must be diced: transparent material 16, which is generally glass and is hard and brittle; wavelength converting layer 14, which is generally a silicone-based lamination layer inter-dispersed with phosphor particles and is soft and nearly viscous, but tough; and dielectric material 12 between LEDs 10, which is generally epoxy with silica particle fillers and is brittle.

Transparent layer 16 is typically the thickest part of the wafer. Dielectric material 12 may be at least 30 μm thick in some embodiments and no more than 60 μm thick in some embodiments; wavelength converting layer 14 may be at least 50 μm thick in some embodiments and no more than 100 μm thick in some embodiments; transparent material 16 may be at least 100 μm thick in some embodiments and no more than 300 μm thick in some embodiments.

Bare glass wafers are typically diced using resin-bonded diamond grit blades on a mechanical saw. Mechanical blade dicing relies on abrasion. Blades are formed by using different types of binding materials to hold diamond grits of designated sizes together. During cutting, freshly exposed tips of the diamond grains continuously scrape against the wafer. The wafer wears on the blade during sawing. As the diamond tips dull, the diamond bits fall off the blade and new bits emerge. The abrasion debris created by sawing is carried away in pockets formed by diamonds falling off the blade. Glass is resistant to abrasion, so the exposed diamond tips quickly become dull. Accordingly, glass is conventionally sawed with a blade with a soft binding material such as resin, such that the outer most diamonds fall off easily, exposing new diamonds in order to maintain the blade's cutting power. Hard binding materials such as metal, when sawing abrasion-resistant materials such as glass, can generate heat sufficient to melt the blade.

Due to limitations of blade fabrication, the thinnest possible resin-bonded blades are 50-100 μm wide, resulting in 55-110 μm kerf widths when such blades are used on a wafer. Metal-bonded blades can be made to 15-20 μm in width, resulting in 20-25 μm kerf widths. Each wafer illustrated in FIG. 1 includes an epitaxially grown semiconductor wafer. Such wafers are expensive to produce. Accordingly, kerf widths are kept as narrow as possible to reduce waste of expensive epitaxial material. Conventional resin-bonded blades are not preferred for dicing the wafer illustrated in FIG. 1, because the kerf widths waste a great deal of epitaxial material, which may increase the cost of producing an LED.

In embodiments of the invention, a thin, metal-bonded diamond grit dicing blade is used to dice a wafer including a wavelength converting layer, such as the wafer illustrated in FIG. 1. The presence of wavelength converting particles, typically phosphor particles, in the wavelength converting layer, and optional particles in dielectric material 12 such as $SiO_2$ fillers, create a self-dressing effect on the blade that maintains the abrasion level. The particles are hard, numerous (for example, 50 to 60% of the volume of layers 14 and 12 in some embodiments), and large (for example, 10 to 50 μm in diameter in some embodiments). When a metal-bonded dicing blade impacts on these particles at processing speeds—rpm in ranges of 30,000 to 50,000 in some embodiments—the counter-abrasion by the wafer on the blade causes substantially uniform wear on the outer layer of the blade. The impacts are strong enough that the hard metal-bonding on the blade erodes, such that fresh diamond grits emerge continuously to the surface of the blade, similar to a dressing preparation. The newly emerging cutting surfaces of the blade, as a result of the in-process self-dressing by the above-described particles, prevents diamond dulling and enables dicing of glass layer 16 with a metal-bonded blade.

Thin, metal-bonded diamond grit dicing blades such as those conventionally used for Si wafer dicing may be used in embodiments of the invention. The particular blade used may depend on variations in particle size and particle loading levels of the above-described blade self-dressing particles in the wafer, which may be determined by the intended application of the LED. The wafer is placed on a dicing frame 44 with the LEDs 10 facing up for alignment, as illustrated in FIG. 3. Since the wafer may create wear on the blade, dicing may include blade exposure check steps at periodic intervals, for example after a given number of streets 46 have been cut. At the blade exposure check steps, the height and/or cut depth of the blade may be adjusted to account for wear on the blade.

In some embodiments, the wafer illustrated in FIG. 1 is diced in more than one cutting step. In a first cutting step, a first portion of the thickness of the wafer is cut. In a second cutting step, the remaining thickness of the wafer is cut.

Surface ablation laser scribing and mechanical sawing with thin, metal-bonded dicing blades are used to dice the layers 12 and 14. Both techniques can be adapted for narrow kerf widths, for example less than 25 µm. Layer 16 may be diced by mechanical sawing with a wide, resin-bonded blade or using sub-surface laser scribing and die break singulation. Different permutations of these dicing techniques are described below.

Figure 4A:
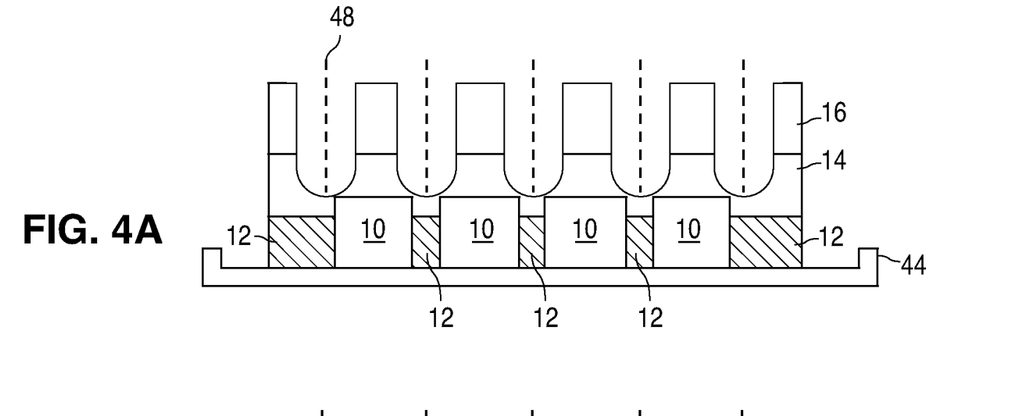
FIG. 4A illustrates partially sawing a wafer with a wide blade.
Figures 4B, 5A:
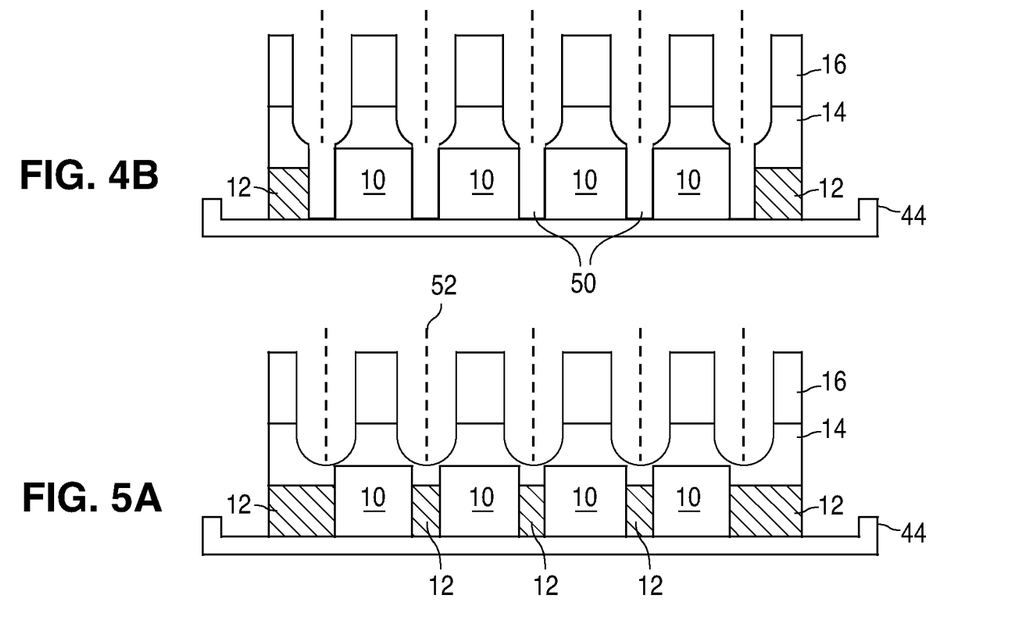
FIG. 4B illustrates sawing through the remaining thickness of the wafer in FIG. 4A with a narrow blade.
FIG. 5A illustrates partially sawing a wafer with a wide blade.

FIGS. 4A and 4B illustrate sawing with a wide blade combined with sawing with a narrow blade. In FIG. 4A, the wafer illustrated in FIG. 1 is disposed on a dicing frame 44 with transparent layer 16 facing up. A wide, resin-bonded blade is used to saw through transparent layer 16 and a portion of the thickness of wavelength converting layer 14. The sawing process illustrated in FIG. 4A creates wide openings 48 that expose the remaining thickness of wavelength converting layer 14 and material 12 below wavelength converting layer 14. In FIG. 4B, a thin metal bonded blade is used to saw through the remaining thickness of wavelength converting layer 14 and material 12, to complete dicing. Sawing in FIG. 4B begins at the bottom of the kerf 48 opened in FIG. 4A. The openings 50 created in FIG. 4B are narrower than the openings 48 created in FIG. 4A.

Figure 5B:
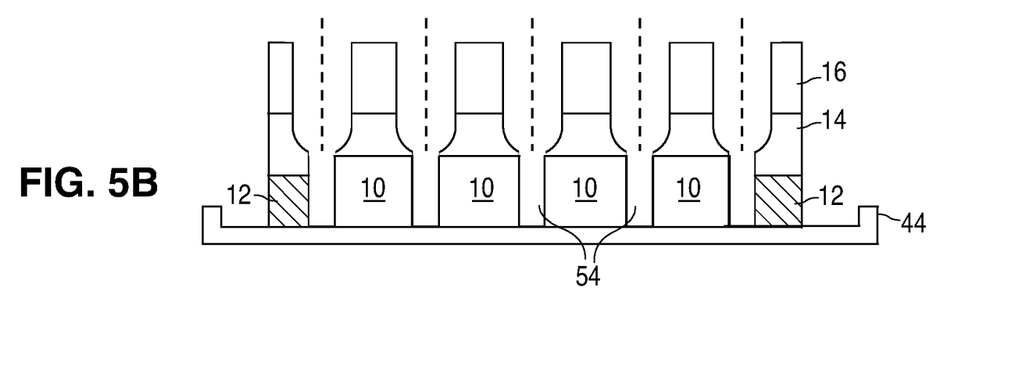
FIG. 5B illustrates cutting through the remaining thickness of the wafer in FIG. 5A with ablation laser.

FIGS. 5A and 5B illustrate sawing with a wide blade combined with laser ablation. In FIG. 5A, the wafer illustrated in FIG. 1 is disposed on a dicing frame 44 with transparent layer 16 facing up. A wide, resin-bonded blade is used to saw through transparent layer 16 and a portion of the thickness of wavelength converting layer 14. The sawing process illustrated in FIG. 5A creates wide openings 52 that expose the remaining thickness of wavelength converting layer 14 and material 12 below wavelength converting layer 14. In FIG. 5B, an ablation laser is used to melt the remaining thickness of wavelength converting layer 14 and material 12, to complete dicing. Ablation in FIG. 5B begins at the bottom of the kerf 52 opened in FIG. 5A. The openings 54 created in FIG. 5B are narrower than the openings 52 created in FIG. 5A.

Figure 6A:
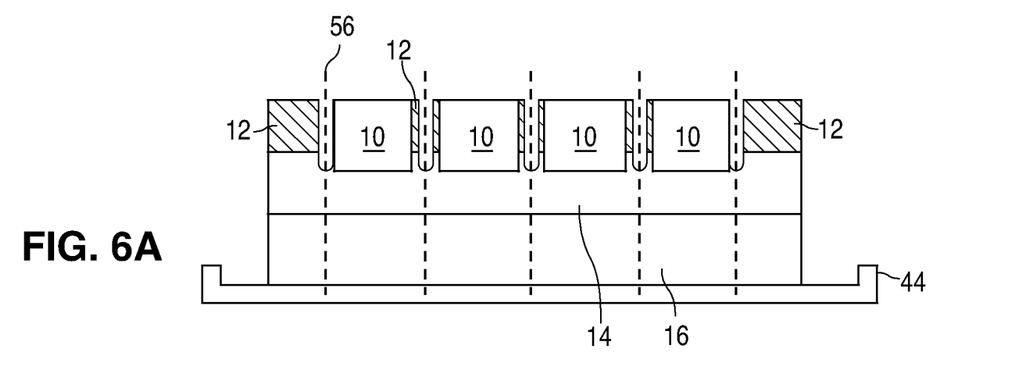
FIG. 6A illustrates partially sawing a wafer with a narrow blade.
Figure 6B:
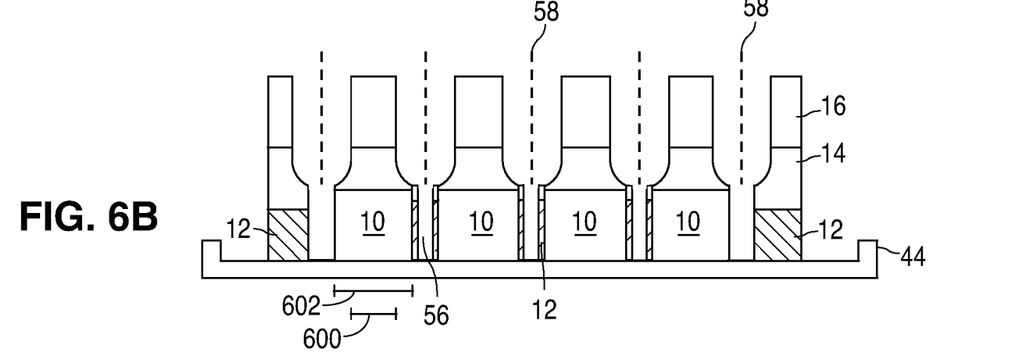
FIG. 6B illustrates flipping the wafer over and sawing through the remaining thickness of the wafer in FIG. 6A with a wide blade.

FIGS. 6A and 6B illustrate sawing with a narrow blade combined with sawing with a wide blade, where the wafer is flipped between the two sawing processes. In FIG. 6A, the wafer illustrated in FIG. 1 is disposed on a dicing frame 44 with LEDs 10 facing up. A narrow, metal-bonded blade is used to saw through material 12 between LEDs 10 and a portion of the thickness of wavelength converting layer 14. The sawing process illustrated in FIG. 6A creates narrow openings 56 that expose the remaining thickness of wavelength converting layer 14 and transparent layer 16. In FIG. 6B, the wafer is flipped over and disposed on a dicing frame 44 with transparent layer 16 facing up. A wide resin-bonded blade is used to saw through the remaining thickness of wavelength converting layer 14 and transparent layer 16, to complete dicing. The openings 58 created in FIG. 6B are wider than the openings 56 created in FIG. 6A.

Figure 7A:
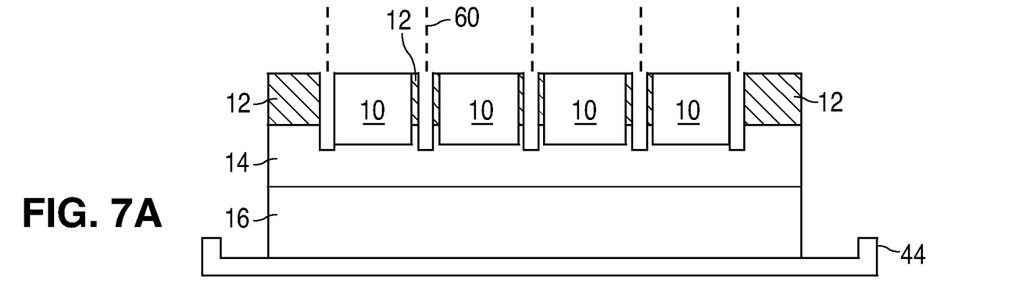
FIG. 7A illustrates partially cutting a wafer with an ablation laser.
Figure 7B:
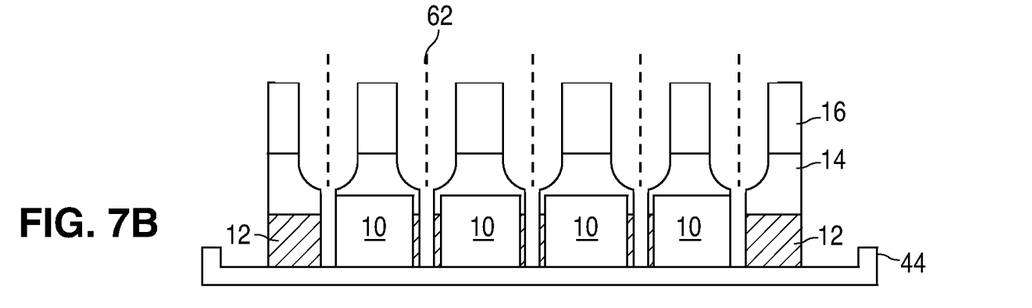
FIG. 7B illustrates flipping the wafer over and sawing through the remaining thickness of the wafer in FIG. 7A with a wide blade.

FIGS. 7A and 7B illustrate laser ablation combined with sawing with a wide blade, where the wafer is flipped between the two processes. In FIG. 7A, the wafer illustrated in FIG. 1 is disposed on a dicing frame 44 with LEDs 10 facing up. An ablation laser is used to melt through material 12 between LEDs 10 and all or a portion of the thickness of wavelength converting layer 14. The ablation process illustrated in FIG. 7A creates narrow openings 60 that expose the remaining thickness of wavelength converting layer 14 and transparent layer 16. In FIG. 7B, the wafer is flipped over and disposed on a dicing frame 44 with transparent layer 16 facing up. A wide resin-bonded blade is used to saw through the remaining thickness of wavelength converting layer 14 and transparent layer 16, to complete dicing. The openings 62 created in FIG. 7B are wider than the openings 60 created in FIG. 7A.

In the embodiments described in FIGS. 4A, 4B, 5A, 5B, 6A, 6B, 7A, and 7B, the transparent layer 16 is diced with a wide, resin-bonded blade. The wide resin-bonded blade creates a large kerf. Accordingly, after dicing, in some embodiments the transparent layer 16 is narrower (in a plane parallel to the top surface of the LED 10) than the LED 10 or group of LEDs 10 to which the transparent layer 16 is attached. For example, as illustrated in FIG. 6B, the width 600 of the transparent layer 16 may be smaller than the width 602 of LED 10. In other words, in a plane parallel to the top surface of LED 10, the transparent layer 16 has a smaller lateral extent than the LED 10. The transparent layer 16 may have a smaller lateral extent than the LED 10 in more than one plane parallel to the top surface of LED 10.

Figure 8A:
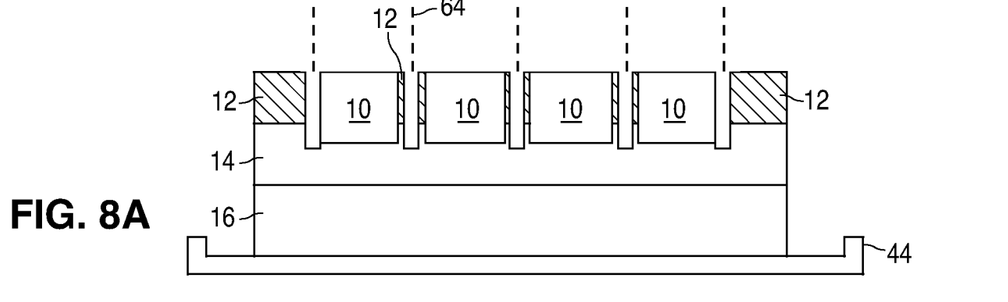
FIG. 8A illustrates partially cutting a wafer with an ablation laser.
Figure 8B:
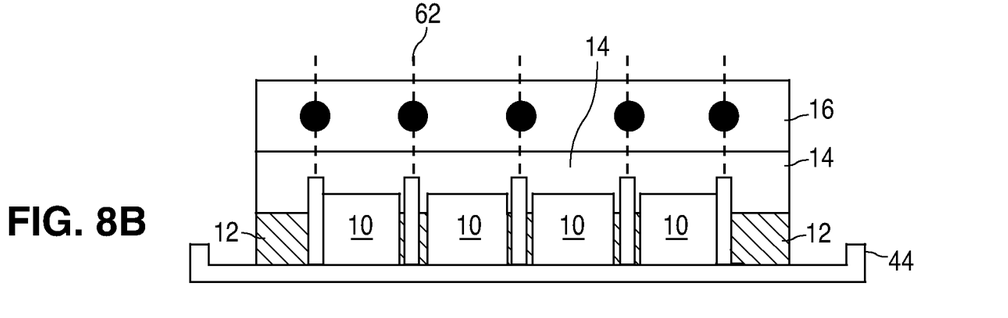
FIG. 8B illustrates flipping the wafer over and scribing and breaking the remaining thickness of the wafer in FIG. 8A.

FIGS. 8A and 8B illustrate laser ablation combined with laser scribing and breaking, where the wafer is flipped between the two processes. In FIG. 8A, the wafer illustrated in FIG. 1 is disposed on a dicing frame 44 with LEDs 10 facing up. An ablation laser is used to melt through material 12 between LEDs 10 and the thickness of wavelength converting layer 14. In FIG. 8B, the wafer is flipped over and disposed on a dicing frame 44 with transparent layer 16 facing up. A below-surface scribing laser is used to create mechanical damage below the surface of transparent layer 16. Lastly, a die breaker is used to separate the LEDs 10 in areas 66 (not shown in the drawings), to complete dicing.

Figure 9A:
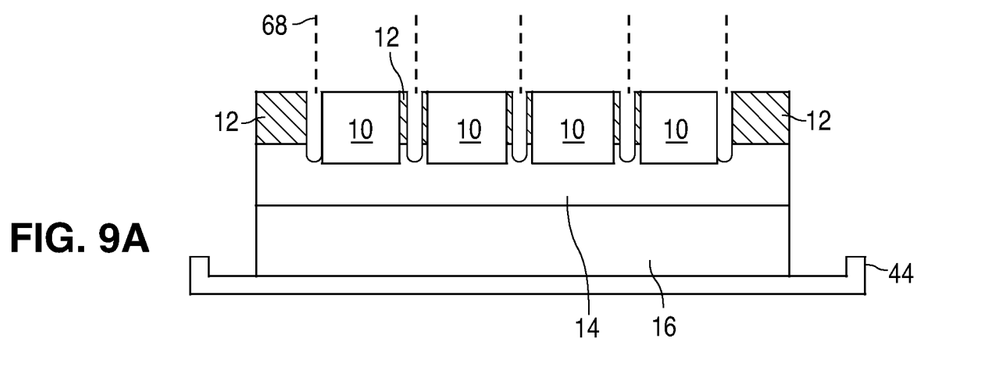
FIG. 9A illustrates partially sawing a wafer with a narrow blade.
Figure 9B:
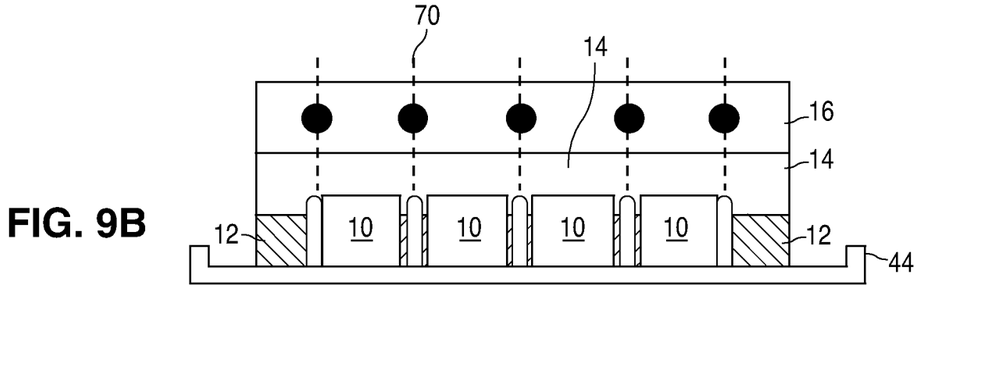
FIG. 9B illustrates flipping the wafer over and scribing and breaking the remaining thickness of the wafer in FIG. 9A.

FIGS. 9A and 9B illustrate sawing with a narrow, metal-bonded blade combined with laser scribing and breaking, where the wafer is flipped between the two processes. In FIG. 9A, the wafer illustrated in FIG. 1 is disposed on a dicing frame 44 with LEDs 10 facing up. A narrow, metal-bonded blade is used to saw through material 12 between LEDs 10 and wavelength converting layer 14. The sawing process illustrated in FIG. 9A creates narrow openings 68 that expose transparent layer 16. In FIG. 9B, the wafer is flipped over and disposed on a dicing frame 44 with transparent layer 16 facing up. A below-surface scribing laser is used to create mechanical damage below the surface of transparent layer 16. Lastly, a die breaker is used to separate the LEDs 10 in areas 70, complete dicing.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A method of dicing a wafer, the method comprising:
   providing a glass layer;
   providing a light emitting device layer comprising light emitting devices and a dielectric material between the light emitting devices;
   providing a wavelength converting layer between the glass layer and the light emitting device layer, the wavelength converting layer comprising particles;
   sawing through the glass layer and the wavelength converting layer with a first metal-bonded diamond grit blade such that an abrasion level of the first metal bonded diamond grit blade is maintained by the particles in the wavelength converting layer; and sawing through the dielectric material between the light emitting devices in the light emitting device layer with a second metal-bonded diamond grit blade, the first metal-bonded diamond grit blade being wider than the second metal-bonded diamond grit blade.

2. The method of claim 1 further comprising:

depositing a III-nitride light emitting layer between an n-type region and a p-type region of each light emitting device and wherein the dielectric material comprise silica particles and the wavelength converting layer comprises phosphor particles.

3. The method of claim 1 wherein providing the glass layer comprises providing the glass layer that is thicker than the light emitting device layer.

4. The method of claim 1 wherein the wavelength converting layer comprises at least 50% phosphor particles by volume and the phosphor particles are at least 10 μm in diameter.

5. The method of claim 4 wherein: the dielectric material comprises at least 50% silica particles by volume and the silica particles are at least 10 μm in diameter and further comprising:

maintaining the abrasion level of the metal bonded diamond grit blade by at least the silica particles.

6. A method of dicing a wafer comprising a glass layer, a light emitting device layer including light emitting devices and a dielectric material between the light emitting devices, the method comprising:

forming a wavelength converting layer between the glass layer and the light emitting device layer, the wavelength converting layer comprises at least 50% phosphor particles by volume and the phosphor particles are at least 10 μm in diameter;

sawing through the glass layer and the wavelength converting layer with a first metal-bonded diamond grit blade; and creating, by the at least 50% phosphor particles by volume in the wavelength converting layer, a self-dressing effect on the metal-bonded diamond grit blade, to maintain an abrasion level.

7. The method of claim 6, further comprising:

sawing through the dielectric material between the light emitting devices in the light emitting device layer with a second metal-bonded diamond grit blade, the first metal-bonded diamond grit blade being wider than the second metal-bonded diamond grit blade.

* * * * *